(12) United States Patent
Verstraete et al.

(10) Patent No.: US 7,029,337 B2
(45) Date of Patent: Apr. 18, 2006

(54) DEVICE AND METHOD FOR ELECTRICALLY CONNECTING MODULES AND A MODULE

(75) Inventors: Fernand Clement Marie Verstraete, Gent (BE); Luc Daelman, Eksaarde (BE); Fredien Jan Elisabeth Waterschoot, Sint-Niklaas (BE)

(73) Assignee: NIKO, naamloze vennootschap, Sint-Niklaas (BE)

( * ) Notice: Subject to any disclaimer, the term of this patent is extended or adjusted under 35 U.S.C. 154(b) by 0 days.

(21) Appl. No.: 10/927,107

(22) Filed: Aug. 27, 2004

(65) Prior Publication Data

US 2005/0037673 A1    Feb. 17, 2005

(30) Foreign Application Priority Data

Aug. 29, 2003  (BE) .................................. 2003/0471

(51) Int. Cl.
*H01R 9/22*  (2006.01)

(52) U.S. Cl. ....................................... 439/715; 439/928

(58) Field of Classification Search ................ 439/259, 439/709, 715, 716, 928
See application file for complete search history.

(56) References Cited

U.S. PATENT DOCUMENTS

| 5,820,420 | A | 10/1998 | Bechaz et al. |
| 6,475,036 | B1 * | 11/2002 | Morikawa .................... 439/716 |
| 6,634,910 | B1 * | 10/2003 | Lieb et al. ................... 439/715 |
| 6,802,737 | B1 * | 10/2004 | Bergner et al. ............. 439/532 |
| 6,896,534 | B1 * | 5/2005 | Ruckerbauer ............... 439/259 |
| 2002/0086577 | A1 | 7/2002 | Koch et al. |

FOREIGN PATENT DOCUMENTS

FR    2 676 586 A    11/1992

* cited by examiner

*Primary Examiner*—Khiem Nguyen
(74) *Attorney, Agent, or Firm*—Bacon & Thomas, PLLC

(57) ABSTRACT

Module, device and method for electrically connecting modules (1–5) whereby a connecting element (9–12) is erected to carry out a lateral shift and a revolving to-and-fro movement during the movement between a first position and a second position.

24 Claims, 5 Drawing Sheets

DEVICE AND METHOD FOR ELECTRICALLY CONNECTING MODULES AND A MODULE

BACKGROUND OF THE INVENTION

1. Field of the Invention

The present invention concerns a device for electrically connecting electric components of modules set up next to each other. The invention also concerns a method for electrically connecting electric components of modules set up next to each other. The invention also concerns a module provided with electric components.

2. Discussion of the Related Art

It is known to mutually connect modules set up next to each other and comprising electric components in an electric manner. Use can hereby be made of a connecting bar comprising several sets of electrically connected pins to electrically connect electric components of both modules by making the pins mesh in accompanying clamp contacts which are present in the modules. The use of such a connecting bar is disadvantageous in that a relatively precise mutual positioning of the modules set up next to each other is necessary, in particular a precise mutual positioning of the clamp contacts of such modules. For, a good electric contact between the pins and the clamp contacts requires a precise mutual positioning of the modules to be electrically connected, in particular of the pins and the accompanying clamp contacts. Moreover, such a connecting bar is disadvantageous in that it can get simply lost. Besides, such a connecting bar is only suitable to be used with certain types of modules whereby the clamp contacts are erected in an analog manner and opposite to the pins of the connecting bar. This also means that for each type of module, an accompanying connecting bar has to be used usually, such that it may be possible that someone will try to use the wrong connecting bar. It is also possible then that such a connecting bar is applied in the wrong manner, such that incorrect electric connections can be made between both modules, as a result of which the modules may be damaged.

It is also known to provide a module with laterally extending pins which can mesh in clamp contacts of a module set up next to said module. In order to obtain a good electric contact between the pins and the clamp contacts, a precise mutual positioning of the modules to be electrically connected is hereby required as well, in particular between the pins and the accompanying clamp contacts. Moreover, such laterally extending pins may thereby hinder the removal or application of a module, in particular the removal or application of a module next to or between other modules.

According to another known possibility, the modules are provided with pins at the back which can each be electrically connected to a contact rail provided on a fastening strut. As such pins and contact rails are not visible to the operator during the application, the electrical connection of the modules may be difficult to realize. Moreover, such pins and contact rails are practically inaccessible and difficult to maintain once the connection has been made.

SUMMARY OF THE INVENTION

The invention aims a device and a method for electrically connecting electric components of modules set up next to each other which do not have the above-mentioned disadvantages and which make it possible to realize an electric connection as mentioned above in a simple manner without the above-mentioned modules having to be precisely positioned in relation to each other.

To this aim, the device according to the invention comprises a connecting element which can move between a first position and a second position, which can be maintained inside the first module in the first position, which can be maintained outside the first module by a second module, set up next to the first module, in a second position, and which comprises contact elements which are electrically connected to electric components of the first module by means of deformable electric conductors, whereby the above-mentioned contact elements are erected such that, in the second position of the connecting element, they provide for a surface contact with contact elements of the second module which are electrically connected to electric components of the second module, and whereby the connecting element is erected such that while moving between the first position and the second position, it carries out a lateral shift and a revolving to-and-fro movement.

The device for the mutual electric connection of modules according to the invention is advantageous in that, thanks to the setting up of the contact elements of the connecting element for making contact with the contact elements of the second module, thanks to the surface contact between the contact elements of the connecting element and the contact elements of the second module, and thanks to the connecting element which can also carry out a revolving movement as mentioned above during the lateral shift, the modules must not be erected precisely next to each other in order to be mutually electrically connected. The constant connection of the connecting element via the deformable electric conductors to the electric components of the first module also offers the advantage that the connecting element cannot get lost and always remains present. Especially maintaining the connecting element in the first module and in the second module also makes it possible to simply connect the modules electrically in a fast and correct manner. The latter implies that an incorrect electric connection of the modules is excluded, since the position of the connecting element can be unambiguously determined in a mechanical manner with the contact elements. As, in the first position, the connecting element is maintained inside the first module, as a result of which the connecting element cannot protrude sideways from the module, such a module can be easily placed next to or between other modules, or it can be removed from besides or between other modules. This also makes it possible to replace such modules in a simple manner. It also allows to place such modules next to each other in a compact manner, and to add or remove modules.

According to a preferred embodiment, the connecting element comprises flat contact elements which can provide for an almost flat electric surface contact with other contact elements. Such contact elements are advantageous in that they make it possible to provide for a good electric connection without an accurate mutual positioning of the contact elements to be electrically connected being required. Moreover, such contact elements always make it possible to simply shift them parallel to themselves.

According to a preferred embodiment, the device according to the invention comprises contact elements of a second module which are set up such that, in the second position of the connecting element, they provide for a surface contact with contact elements of the connecting element. Such contact elements of the second module and such contact elements of the connecting element are advantageous in that they set off an inaccurate alignment of such contact elements. More particularly, they make it possible to set off translations according to three different directions and rotations according to three different axes. Moreover, said contact elements make it possible to ensure a good electric contact, even if the modules are not accurately positioned among themselves. This also allows to position the modules with large mutual tolerances.

According to a preferred embodiment, the connecting element comprises a body with a lateral face, and the contact elements of the connecting element are provided at the height of the lateral face of the connecting element. This enables us to simply provide contact elements which can form a surface contact, more particularly a practically flat electric surface contact with other contact elements. Said lateral face preferably extends according to the longitudinal direction of the connecting element. This makes it possible to direct the contact elements of the connecting element to the contact elements of the second module while both contact elements move towards each other, and after both contact elements have made contact.

According to one embodiment, the contact elements of the connecting element comprise flat contact plates which are erected parallel to the aforesaid lateral face of the connecting element. Providing flat contact plates as contact elements on the connecting element is advantageous in order to prevent damages to such contact elements.

According to one embodiment, the connecting element comprises several contact elements which can co-operate respectively with contact elements of a second module. The different contact elements are hereby erected preferably next to each other in a direction which is perpendicular to the direction of the lateral shift of the connecting element. Such contact elements are preferably also erected at the height of the aforesaid lateral face of the connecting element. Such a set-up makes an accurate mutual positioning of the modules to be connected unnecessary.

According to one embodiment, the contact elements of the second module preferably comprise springy or spring-mounted contact elements. Such contact elements preferably comprise an arched contact part. Such a contact element can be made as an arched leaf spring or as an arched contact plate supported by a spring. Such spring-mounted contact elements, and in particular such spring-mounted arched contact elements guarantee a good electric connection, even if such contact elements to be connected are not accurately positioned in relation to each other or are not mutually aligned. Such contact elements are also advantageous in that, while each electric connection with other contact elements is being formed, they will relatively move in relation to these other contact elements, and in this manner will be cleaned as if it were during each electric connection.

According to a preferred embodiment, the connecting element comprises conducting elements to conduct the connecting element in conductors of the first module while the connecting element is being moved between the first position and the second position which make it possible to move the connecting element laterally, and to rotate the connecting element to and fro around axes which are practically perpendicular to the lateral shift. Such conducting elements are particularly useful to simply bring the connecting element into the second position and to allow the connecting element to carry out the above-mentioned rotational movement. Such a conductor makes it possible to conduct the connecting element in the first module while it is being moved between the first position and the second position. Conducting the connecting element in the first module also offers the advantage that the connecting element cannot get lost and always remains in the module. During said movement, the connecting element can hereby rotate by tilting or turning around said conducting elements which are conducted in the above-mentioned conductors. The connecting element can hereby be conducted in said conductors of the first module with relatively much play.

According to one embodiment, at least the first module also comprises edges which make it possible to direct the connecting element towards the second module. Such edges are useful to bring the connecting element into the second position.

According to one embodiment, the device comprises fastening elements which allow to fix a connecting element maintained in the first module in the above-mentioned first position. Such fastening elements make it possible to maintain the connecting element in a certain position in relation to the first module.

According to one embodiment, the device also comprises fastening elements which make it possible to fix a connecting element maintained in the second module in the above-mentioned second position. Such fastening elements make it possible to maintain the connecting element in a certain position in relation to the second module, which is such that the contact elements of the connecting element and the contact elements of the second module are accurately positioned in relation to each other.

According to a preferred embodiment, the connecting element is maintained in conductors of the second module, practically without any play, in the above-mentioned second position, and it is maintained with a certain play in conductors of the first module. This makes it possible to position the contact elements of the connecting element precisely in relation to the contact elements of the second module. The fact that both modules are not accurately positioned in relation to each other can hereby be set off by the play of the connecting element in the conductors of the first module.

According to one embodiment, the connecting element is erected near the front side of the module. The connecting element is preferably erected such that it can rotate around axes which are perpendicular to the front side of the module. The connecting element is hereby preferably erected near the top side of the module. Such a set-up is advantageous for the accessibility and visibility of the connecting element, and it allows for example to place lamps and the like in a visible manner on the front side of the module. Such a set-up particularly allows to erect low-voltage current elements in the front of the module and to erect power current elements at the back of the module, which also allows to provide the power current elements absorbing much power and generating heat at the back of the modules. Erecting said power current elements at the back also allows to cool these power current elements in a place at the back of the modules, more particularly a place where there is usually enough space to provide for a cooling.

In view of the aim of the invention, the method according to the invention for electrically connecting electric components of modules set up next to each other, comprises shifting a connecting element having contact elements which are electrically connected to electric components of a first module by means of deformable electric conductors, between a first position within the first module and a second position outside the first module, where the above-mentioned contact elements of the connecting element can form a surface contact with contact elements of a second module set up next to the first module which are electrically connected to electric components of the second module, whereby the connecting element between the first position and the second position is moved by shifting the connecting element laterally and by rotating the connecting element to and fro.

According to one embodiment, the method also comprises fixing the connecting element in the first module, in the first position. According to one embodiment, the method also comprises fixing the connecting element in the second module, in the second position.

According to a preferred embodiment, the method also comprises maintaining the connecting element in conductors of the second module, practically without any play, and maintaining the connecting element in conductors of the first module with a certain play, while the above-mentioned connecting element is situated in the above-mentioned second position.

The invention also aims a module which is provided for applying the method according to the invention. To this aim, a module according to the invention comprises a connecting element for electrically connecting electric components of modules set up next to each other which can shift between a first position and a second position, which can be maintained inside the module in the first position, which can be maintained outside the module in the second position by a second module, erected next to the module, and which contains contact elements which are electrically connected to electric components of the module by means of deformable electric conductors, whereby the above-mentioned contact elements are erected such that they form a surface contact with contact elements of the second module, in the second position of the connecting element, which are electrically connected to electric components of the second module, and whereby the connecting element is set up such that it makes a lateral shift and a rotational to and fro movement while moving between the first position and the second position.

According to a preferred embodiment, the module according to the invention also comprises contact elements which are electrically connected to electric components of the module and which can form a surface contact with contact elements of a connecting element of another or a third module erected next to the module.

BRIEF DESCRIPTION OF THE DRAWINGS

The characteristics and further advantages of the invention will be further explained by means of the non-limitative examples of embodiments, represented in the accompanying drawings, in the following detailed description. In this description, the following drawings are referred to, in which.

DESCRIPTION OF THE PREFERED EMBODIMENT

Figure 1:
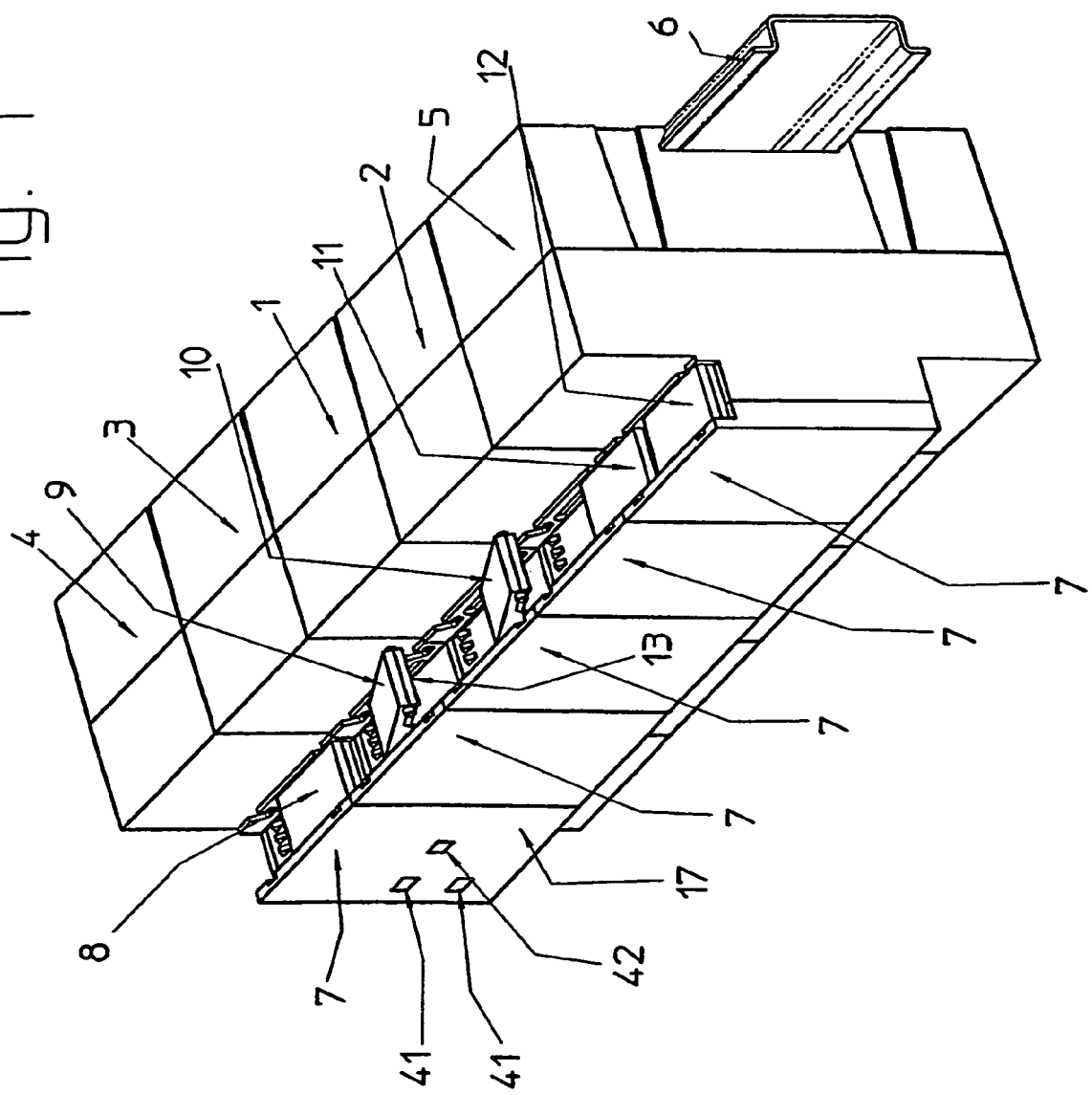
FIG. 1 schematically represents a number of modules of a device according to the invention.

FIG. 1 represents a number of modules 1 to 5 which are provided next to each other on a mounting strut 6. Such a mounting strut 6 may consist of a standardized DIN rail or any other mounting strut. At the height of each module 1 to 5 is provided a device 7 according to the invention for electrically connecting electric components of modules erected next to each other. Each device 7 comprises a connecting element 8, 9, 10, 11 or 12 which is erected in a movable manner between a first position and a second position. In FIG. 1, the connecting elements 8 and 12 are maintained within the respective modules 4 and 5 in their first position, the connecting element 11 is maintained outside the module 2 in its second position by the module 5 set up next to the module 2, and the connecting elements 9 and 10 are situated in a position between their first position and their second position. As can be seen in FIG. 1, the connecting elements 8 to 12 are provided near the front side of the modules 1 to 5. Moreover, the connecting elements 8 to 12 are hereby provided near the top side of the modules 1 to 5.

Figure 2:
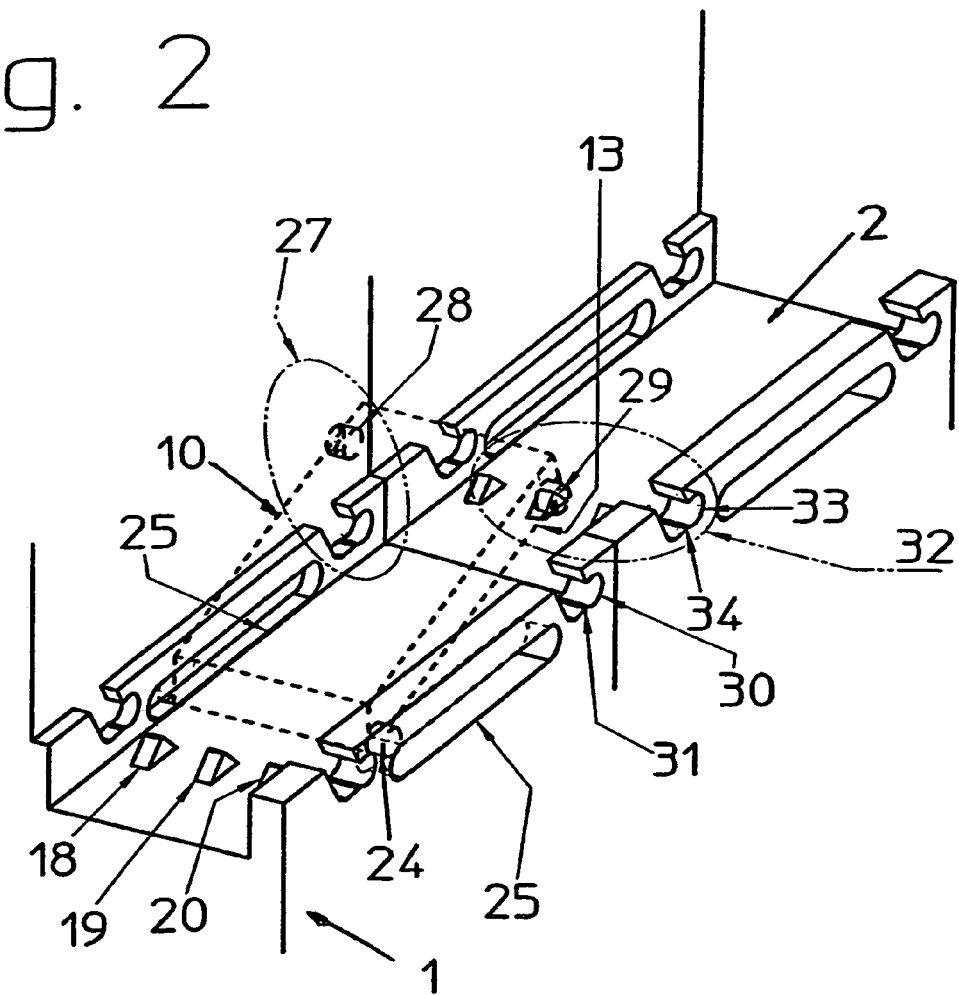
FIG. 2 schematically represents a part of two modules set up next to each other, provided with a device according to the invention.
Figure 3:
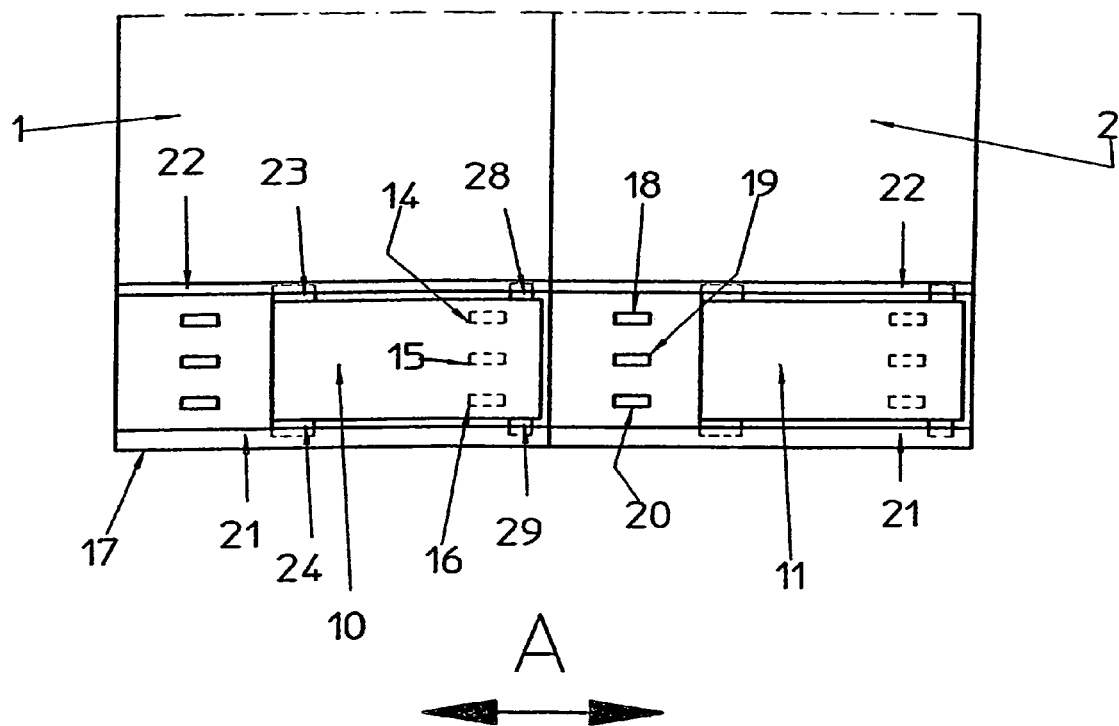
FIG. 3 represents a top view of FIG. 2.

FIGS. 2 and 3 represent parts of modules 1 and 2 provided next to each other, whose electric components can be electrically connected by means of a connecting element 10. The following description for the modules 1 and 2 for the connecting element 10 can also be applied to the other modules to be electrically connected and the other connecting elements 8, 9, 11, 12.

The connecting element 10 comprises a body which is practically beam-shaped and which comprises a lateral face 13 onto which are provided contact elements 14, 15 and 16. This lateral face 13 extends in the longitudinal direction of the connecting element 10. The connecting element 10 can hereby be laterally moved between the aforesaid first position and the aforesaid second position according to the direction A. This connecting element 10 is hereby erected such that it can rotate around axes which are perpendicular to the aforesaid longitudinal direction, situated in the above-mentioned direction A or in the above-mentioned lateral movement. In the given set-up, the connecting element 10 can rotate or turn around axes which are perpendicular to the front side 17 of the module 1, and the connecting element 10 can be laterally moved parallel to the front side 17 of the module 1.

In the given embodiment, the contact elements 14 to 16 of the connecting element 10 consist of flat contact plates which are designed to be able to form a surface contact, more particularly an almost flat electric surface contact with contact elements 18, 19 and 20 to be electrically connected of a module 2 erected next to the module 1. A surface contact may also be called a press-on contact. These flat contact plates are hereby erected parallel to the aforesaid lateral face 13 of the connecting element 10. The contact elements 14 to 16 of the connecting element provided on the module 1 and the contact elements 18 to 20 of the module 2 are hereby erected such that they can mutually form an almost flat electric surface contact in the second position of the connecting element 10.

In the given embodiment, the different contact elements 14 to 16 are erected next to each other in a direction which is perpendicular to the direction of the lateral movement or to the longitudinal direction of the connecting element 10. The first module 1 hereby comprises edges 21 and 22 which make it possible to direct the connecting element 10 to the module 2. Moreover, the module 2 can comprise analogous edges 21 and 22 to this end. These edges 21 and 22 extend according to the above-mentioned direction A and serve to direct the connecting element 10 or to keep directing it during the lateral shift from the module 1 to the module 2 according to the direction A.

As represented in FIGS. 2 and 3, the connecting element 10 also comprises conducting elements 23 and 24 which consist of pins provided on the sides of the connecting element 10. These conducting elements 23 and 24 make it possible to conduct the connecting element 10 between the first position and the second position during the shift, in conductors 25 provided at the height of the edges 21, 22 of the module 1 and which are formed of grooves, for example. These conducting elements 23 and 24 can move in the conductors 25 with a certain play. The above-mentioned conducting elements 23 and 24, provided near the sides, which mesh in conductors 25, make it possible to laterally move the connecting element 10 and to rotate the connecting element 10 to and fro around axes which are practically perpendicular to the lateral shift or to the direction A. The above-mentioned axes are hereby determined by the axis determined by conducting elements 23 and 24 erected in each other's prolongation.

The connecting element 10 can also be fixed with fastening elements 27 in relation to the module 1, more particularly the connecting element 10 maintained within the module 1 can be fixed inside the module 1 in the above-mentioned first position. In the given example, these fastening elements 27 comprise for example conducting elements 28 and 29 which consist of pins, which are provided on the sides of the connecting element 10, as represented, and which can work in conjunction with conductors 30 provided in the first module 1. These conductors 30 comprise grooves which are made L-shaped, for example, and which comprise a collar 31, for example, behind which the conducting elements 28 or 29 can mesh when they have been conducted in these conductors 30 over a certain distance, such that the connecting element 10 can be held behind the collars 31 provided in the conductors 30. The conducting elements 28 and 29 are hereby being held behind the collars 31 in the conductors 30, preferably practically without any play.

In an analogous way, the device comprises fastening elements 32 which make it possible to fix a connecting element 10 being held in the second module 2 in the above-mentioned second position. In the given example, these fastening elements 32 comprise the above-mentioned conducting elements 28 and 29 provided on the sides of the connecting element 10 and which can work in conjunction with conductors 33 provided in the second module 2. These conductors 33 comprise grooves which are made L-shaped as well, for example, and which comprise a collar 34, for example, behind which the conducting elements 28 and 29 can mesh when they have been conducted over a certain distance in said conductors 33, such that the connecting element 10 can be held behind the collars 34 provided in the conductors 33. The conducting elements 28 and 29 are hereby preferably held practically without any play behind the collars 34 in the conductors 33. The latter is advantageous in that the contact elements 14 to 16 are hereby positioned unambiguously as well in relation to the contact elements 18 to 20.

Figure 4:
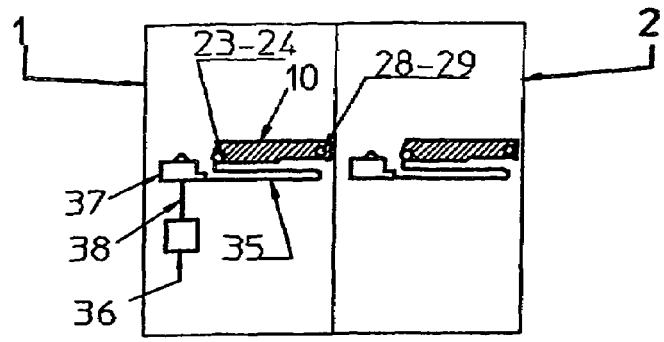
FIGS. 4 to 7 represent the connecting element in successive positions.
Figure 5:
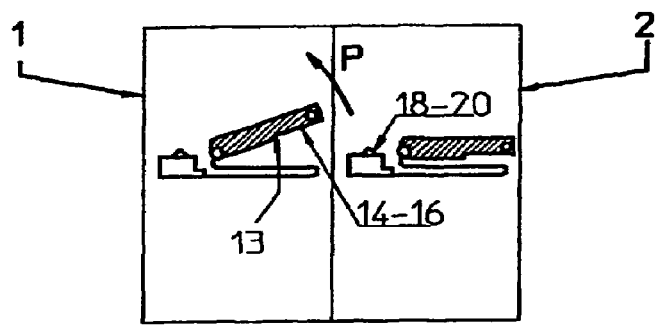

As is illustrated among others in FIGS. 4 to 7, the connecting element 10 comprises contact elements 14, 15 and 16 which are electrically connected to electric components 36 of the first module 1 by means of deformable electric conductors 35. The electric conductors 35 are fixed to a holder 37 which also carries contact elements 18, 19 and 20. The electric conductors 35 are hereby electrically connected in a continuous manner to the electric components 36 via electric conductors 38. According to one embodiment, the electric conductors 35 and 38 can be made of copper bands provided on a deformable foil. The electric components 36 may consist of a dimmer, a relay or any other electric component. The holder 37 is for example fixed tight to the module 1, for example by means of glue or a snap-in connection. As indicated in FIG. 5, the contact elements 14 to 16 are fixed to the connecting element 10 at the height of the lateral face 13. The contact elements 14 to 16 are erected so as to form an almost flat electric surface contact with the contact elements 18 to 20 of the second module 2, in both positions of the connecting element 10, which are electrically connected in turn to electric components 36 of the second module 2 via electric conductors 38. The contact elements 14 to 16 of the module 1 are electrically connected to the contact elements 18 to 20 of this module 1 in a continuous manner as well, whereas the contact elements 14 to 16 of the module 2 remain continuously electrically connected to the contact elements 18 to 20 of this module 2 as well, in an analogous manner.

Figure 7:
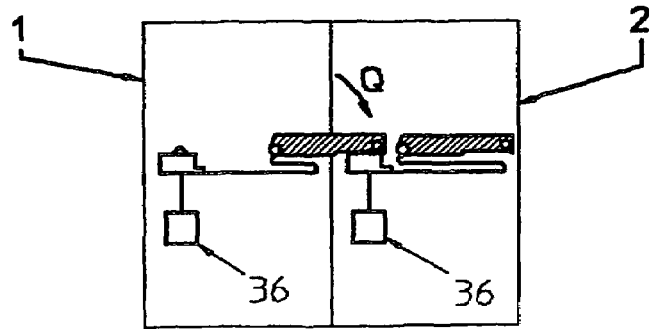

In the position of FIG. 4, the connecting element 10 is situated inside the first module 1 in the first position, and it is maintained in the first position via the conducting elements 28 and 29 of the fastening elements 27. In the position of FIG. 7, the connecting element 10 is situated partly outside the first module 1 and partly inside the second module 2 in the second position, and it is maintained in the second position via the conducting elements 28 and 29 of the fastening elements 32. The connecting element 10 is hereby erected so as to carry out a lateral movement according to the direction A during the shift between the first position and the second position, and to hereby carry out a to and fro rotational movement as well. The conducting elements 23 and 24 are hereby conducted in the conductors 25 with relatively much play. Such a play makes it possible to position the contact elements 14 to 16 in the above-mentioned second position precisely and practically without any play in relation to the second module 2 by means of the conducting elements 28 and 29 which work in conjunction with the conductors 33, whereas the conducting elements 23 and 24 further stay in the conductors 25 of the first module 1. Thanks to the aforesaid play, the latter remains possible, even if the modules 1 and 2 are positioned relatively inaccurate in relation to each other.

Figure 6:
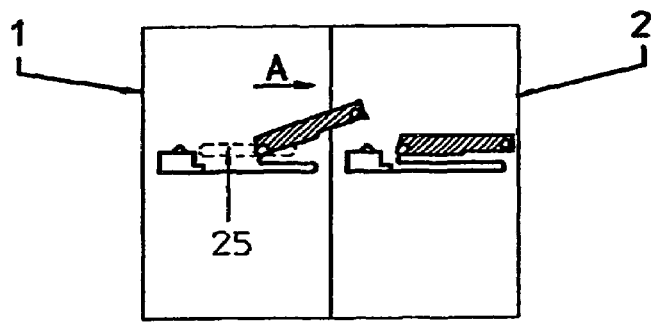

A method for moving from the position of FIG. 4 into the position of FIG. 7 will be explained hereafter. From the position of FIG. 4, the connecting element 10 is rotated to or turned to according to arrow P around the conducting elements 23 and 24 situated in the conductors 25. Next, the connecting element 10 is laterally moved along the conductor 25 according to direction A, until the position of FIG. 6 is reached. Next, the connecting element 10 is rotated back or turned back according to arrow Q in order to make sure that the contact elements 14 to 16 make contact with the contact elements 18 to 20 and the position of FIG. 7 is reached. The connecting element 10 can hereby be fixed in the first position as well as in the second position by respective fastening elements 27 and 32. According to a variation on the method, it is also possible to rotate the connecting element 10 to and fro, whereas the connecting element 10 is moved laterally according to direction A.

If fastening elements 27 and 32 are used with the aforesaid conductors 30 and 33 comprising L-shaped grooves with collars 31 and 34, the connecting element 10 is for example first laterally moved away from the module 2 and then rotated around a small angle in order to make sure that the conducting elements 28 and 29 can move away from the collars 31 outside the conductors 30 of the module 1. Such a movement can for example be supported by the spring force of the electric conductors 35 which acts on the connecting element 10. Next, the connecting element 10 can for example be rotated further over an angle, while the connecting element 10 is already moved sideways towards the module 2, and the connecting element 10 can already be rotated back over an angle while the connecting element 10 is moved still further sideways. Next, the connecting element 10 can be rotated further back and then moved further sideways in order to allow the conducting elements 28 and 29 to move in the conductors 33 of the module 2 up to behind the collars 34. In this position, the contact elements 14 to 16 of the first module 1 form an electric surface contact with the contact elements 18 to 20 of the second module 2. In the given embodiment, the latter lateral movement can be carried out without any problems, as the contact elements 14 to 16 are made flat and form an aforesaid surface contact.

It is clear that every module 1 to 5 can be provided, in an analogous manner as described for the module 1, with a connecting element 9 to 12 with contact elements 14 to 16 which are connected to electric components 36 of the respective module 1 to 5 via deformable electric conductors 35, and which contact elements 14 to 16 are also connected, via the above-mentioned electric conductors 35 and possible conductors provided in the holder 37, to contact elements 18 to 20 of the respective module 1 to 5. This also means, among others, that the contact elements 14 to 16 and the contact elements 18 to 20 of each module are connected to each other and to the electric components 36 of the module.

In the given embodiment, the contact elements 18 to 20 of the module 1 can form a practically flat electric surface contact with the contact elements 14 to 16 of the connecting element 9 of a preceding or third module 3 erected next to the module 1. This implies that the contact elements 14 to 16 of a specific module can make contact with contact elements 18 to 20 of a following module, and the contact elements 18 to 20 of a certain module can make contact with contact elements 14 to 16 of a preceding module.

Figure 8:
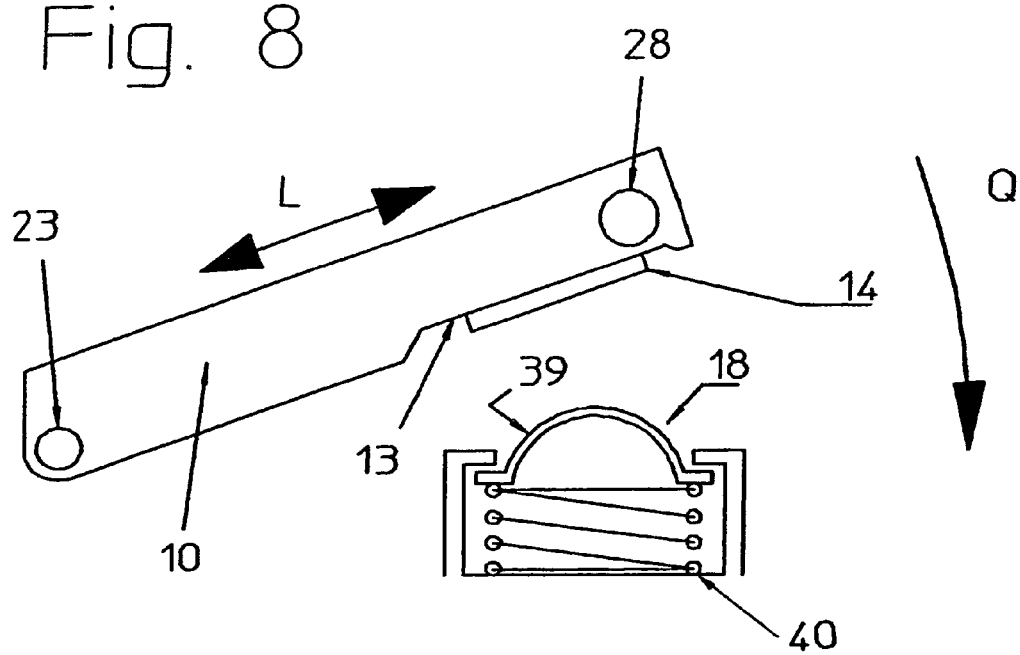
FIGS. 8 and 9 are enlarged representations of an embodiment of contact elements in an opened and closed position.
Figure 9:
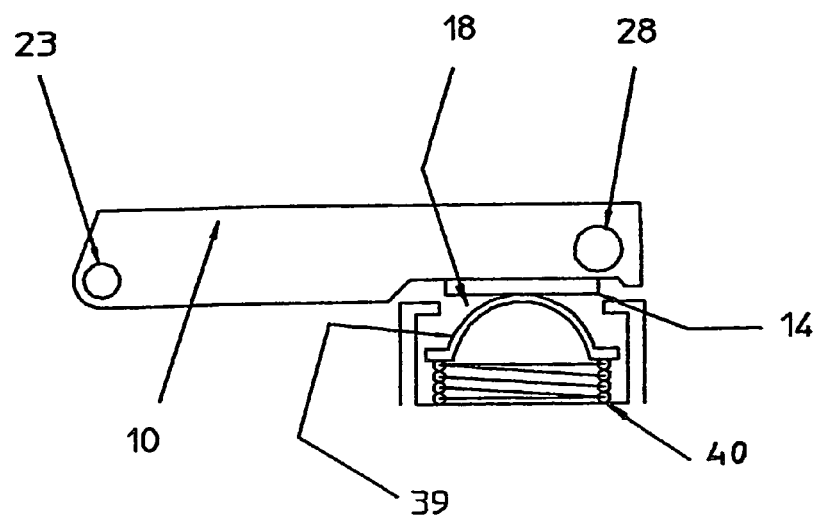

FIG. 8 schematically represents an embodiment for the contact elements 14 and 18 before they make a practically flat electric surface contact or are situated in what is called an open situation. The contact element 14 hereby consists of a flat contact plate which is set up according to the longitudinal direction L of the connecting element 10. The contact element 18 of the second module 2 is hereby made as a springy or spring-mounted contact element. This contact element 18 comprises an arched contact part 39 which consists for example of a leaf spring. This contact part 39 is supported by a spring 40. As represented in FIG. 9, both contact elements 14 and 18, in what is called a closed condition, make contact with each other, more particularly make a practically flat electric surface contact with each other. Hereby can be seen that, because of said contact, the contact part 39 has been elastically deformed or has been deformed in a springy manner, whereas the spring 40 has been pressed somewhat. This makes it possible to obtain a good electric contact between both contact elements 14 and 18. In an analogous manner, the contact elements 15 and 16 respectively, can make a good electric contact with the contact elements 19 and 20.

As shown in FIG. 1, for example thanks to the set-up of the connecting elements 9 to 12 according to the invention, other elements can be erected at the height of the front side of the modules 1 to 5. Such elements may for example consist of control lights 41 or switches 42.

It is clear that the obtained electric connection according to the invention can be used for electrically conducting communication signals, for example analogous or digital low-tension current communication signals, as well as for signals for electric energy transfer, for example high-tension current signals for feeding an electric unit. It is clear that the invention is in the first place meant for electrically conducting low-tension current signals.

The device according to the invention can be used in different applications. Such a device is suitable, among others, to be used in electric installations for home appliances or what are called demotic systems. The modules hereby comprise for example a high-tension current part for feeding electric units, and a low-tension current part for controlling an above-mentioned high-tension current part. The device according to the invention is preferably used in the low-tension current part. Such modules may for example consist of an electronically controlled dimmer, an electronically controlled relay, an electronically controlled switch, an electronically controlled current interrupter, and such electronically controlled units.

According to an alternative embodiment, the contact elements of the connecting element 9 to 12 may consist of spring-mounted contact elements, whereas the contact elements of the module to be electrically connected hereby consist of flat contact plates, which, in the second position of the connecting element 9 to 12, are preferably parallel to the aforesaid lateral face 13 of the connecting element 9 to 12. According to another variant, the contact elements of the connecting element as well as the contact elements of the module to be electrically connected may consist of spring-mounted contact elements. According to a non-represented variant, the connecting element can also be erected such that it can turn or rotate around axes which are for example parallel to the front side 17 of the module.

It is clear that the invention is not restricted to the electric connection of three contact elements 14, 15, 16 of a connecting element 10 with three respective contact elements 18, 19, 20 of a module 2, but that, according to the invention, it is also possible to mutually connect more or less than each time three of such contact elements in an electric manner, for example four or two of such contact elements.

It is clear that the conducting elements 23 and 24 must not necessarily have a round shape. According to a non-represented variant, they can be elongated. Such elongated conducting elements extend for example practically according to the longitudinal direction of the conductors 25, in the first position as well as in the second position. If there is relatively little play, this also means that the angle over which a connecting element 10, provided with such longitudinal conducting elements, can rotate or turn is only relatively small. The conducting elements 28 and 29 can also be embodied as mentioned above.

The use of contact elements according to the invention, forming a surface contact, is advantageous in that no precise mutual positioning of such contact elements according to the surface contact is required, which makes it possible to position such contact elements with relatively large mutual tolerances. This is also advantageous in that no precise mutual positioning of the modules to be electrically connected is required. This means that a good electric connection can be obtained, even when such modules are not positioned at a certain mutual distance or with a certain mutual play. Such contact elements also keep guaranteeing a good electric contact, even when the contact elements are shifted somewhat in relation to each other after the electric connection has been formed, for example under the influence of expansions due to temperature differences.

The device and the module according to the invention offer as further advantages that they can be made in a simple manner and at a favorable cost. Moreover, the connecting element 9 to 12 of the device, or of the module according to the invention, thanks to its simple construction and its possible set-up, can be provided such that it is easily visible. Moreover, the connecting element 9 to 12 is easy to control by an operator.

Naturally, the device, the method and the module according to the invention are by no means limited to the above-described embodiments given as an example, but they may also comprise variants and combinations of these embodiments. The devices and modules according to the invention can hereby also comprise all combinations of embodiments described for the modules or for the devices.

What is claimed is:

1. A device for electrically connecting electric components of modules set up next to each other, wherein the device comprises a connecting element which can move between a first position and a second position, which can be maintained inside a first module in the first position, which can be maintained outside the first module by a second module, set up next to the first module, in a second position, and which comprises contact elements which are electrically connected to electric components of the first module by means of deformable electric conductors, whereby the above-mentioned contact elements are erected such that, in the second position of the connecting element, they provide for a surface contact with contact elements of the second module which are electrically connected to electric components of the second module, and whereby the connecting element is erected such that while moving between the first position and the second position, it carries out a lateral shift and a revolving to-and-fro movement.

2. The device according to claim 1, wherein the connecting element comprises flat contact elements which can form a practically flat electric surface contact with contact elements to be electrically connected.

3. The device according to claim 1, wherein the device also comprises contact elements of a second module which are set up such that, in the second position of the connecting element, they provide for a surface contact with contact elements of the connecting element.

4. The device according to claim 1, wherein the connecting element comprises a body with a lateral face, and in that the contact elements of the connecting element are provided at the height of the lateral face of the connecting element.

5. The device according to claim 4, wherein the lateral face extends according to the longitudinal direction of the connecting element.

6. The device according to claim 4, wherein the contact elements of the connecting element comprise flat contact plates which are erected parallel to the aforesaid lateral face of the connecting element.

7. The device according to claim 1, wherein the connecting element comprises several contact elements which can co-operate with contact elements of a second module respectively.

8. The device according to claim 7, wherein the different contact elements are erected next to each other in a direction which is perpendicular to the direction of the lateral shift of the connecting element.

9. The device according to claim 1, wherein the contact elements of the second module comprise springy or spring-mounted contact elements.

10. The device according to claim 9, wherein the contact elements comprise an arched contact part.

11. The device according to claim 1, wherein the connecting element comprises conducting elements to conduct the connecting element in conductors of the first module while the connecting element is being moved between the first position and the second position which make it possible to move the connecting element laterally, and to rotate the connecting element to and fro around axes which are practically perpendicular to the lateral shift.

12. The device according to claim 1, wherein at least the first module comprises edges which make it possible to direct the connecting element towards the second module.

13. The device according to claim 1, wherein the device comprises fastening elements which allow to fix a connecting element maintained in the first module in the above-mentioned first position.

14. The device according to claim 1, wherein the device comprises fastening elements which make it possible to fix a connecting element maintained in a second module in the above-mentioned second position.

15. The device according to claim 1, wherein the connecting element is maintained in conductors of the second module, practically without any play, in the above-mentioned second position, and it is maintained with a certain play in conductors of the first module.

16. The device according to claim 1, wherein the connecting element is erected near the front side of the module.

17. The device according to claim 16, wherein the connecting element is erected such that it can rotate around axes which are perpendicular to the front side of the module.

18. The device according to claim 16, wherein the connecting element is erected near the top side of the module.

19. A method for electrically connecting electric components of modules set up next to each other, wherein the method comprises shifting a connecting element having contact elements which are electrically connected to electric components of a first module by means of deformable electric conductors, between a first position within the first module and a second position outside the first module, where the above-mentioned contact elements of the connecting element can form a surface contact with contact elements of a second module set up next to the first module which are electrically connected to electric components of the second module, whereby the connecting element is moved between the first position and the second position by laterally shifting the connecting element and by rotating the connecting element to and fro.

20. The method according to claim 19, wherein the method comprises fixing the connecting element in the first module, in the first position.

21. The method according to claim 19, wherein the method comprises fixing the connecting element in the second module, in the second position.

22. The method according to claim 19, wherein the method comprises maintaining the connecting element in conductors of the second module, practically without any play, and maintaining the connecting element in conductors of the first module, with a certain play, while the above-mentioned connecting element is situated in the above-mentioned second position.

23. A module provided with electric components, wherein a module comprises a connecting element for electrically connecting electric components of modules erected next to each other which can move between a first position and a second position, which can be maintained inside the first module in the first position, which can be maintained outside the first module by a second module, set up next to the first module, in a second position, and which comprises contact elements which are electrically connected to electric components of the first module by means of deformable electric conductors, whereby the above-mentioned contact elements are erected such that, in the second position of the connecting element, they provide for a surface contact with contact elements of the second module which are electrically connected to electric components of the second module, and whereby the connecting element is erected such that while moving between the first position and the second position, it carries out a lateral shift and a revolving to-and-from movement.

24. The module according to claim 23, wherein the module comprises contact elements which are electrically connected to electric components of the module and which can form a surface contact with contact elements of a connecting element of a third module erected next to the module.

* * * * *